United States Patent [19]

Cheng et al.

[11] Patent Number: 4,771,325
[45] Date of Patent: Sep. 13, 1988

[54] INTEGRATED PHOTODETECTOR-AMPLIFIER DEVICE

[75] Inventors: Julian Cheng, Chatham; Bernard C. DeLoach, Jr., New Providence; Stephen R. Forrest, Chatham, all of N.J.

[73] Assignee: American Telephone & Telegraph Co., AT&T Bell Laboratories, Murray Hill, N.J.

[21] Appl. No.: 700,441

[22] Filed: Feb. 11, 1985

[51] Int. Cl.[4] ................. H01L 27/14; H01L 33/00
[52] U.S. Cl. ............................... 357/30; 357/16; 357/22; 357/41
[58] Field of Search .............. 357/30, 41, 16, 22

[56] References Cited

U.S. PATENT DOCUMENTS

| | | | |
|---|---|---|---|
| 4,314,858 | 2/1982 | Tomasetta et al. | 357/30 |
| 4,438,447 | 3/1984 | Copeland, III | 357/30 |
| 4,447,746 | 5/1984 | Fang et al. | 357/30 |
| 4,517,581 | 5/1985 | Thompson | 357/30 |
| 4,544,938 | 10/1985 | Scholl | 357/30 |
| 4,625,225 | 11/1986 | Goodfellow et al. | 357/22 A |
| 4,625,226 | 11/1986 | Antell | 357/16 |

OTHER PUBLICATIONS

*IEEE Transactions on Microwave Theory and Techniques,* vol. MTT-30, No. 10, Oct. 1982, U. Koren et al., "Recent Developments in Monolithic Integration of InGaAsP/InP Optoelectronic Devices", pp. 1641–1649.
*IEEE Electron Device Letters,* vol. EDL-5, No. 7, Jul. 1984, D. Wake et al., "A Self-Aligned $In_{0.53}Ga_{0.47}As$ Junction Field-Effect Transistor Grown by Molecular Beam Epitaxy", pp. 285–287.

*Primary Examiner*—William D. Larkins
*Attorney, Agent, or Firm*—W. G. Nilsen

[57] ABSTRACT

An integrated photodetector-amplifier is described which is planar and exhibits excellent circuit characteristics including low input capacitance, high speed, and high sensitivity. Also, certain self-alignment features and a planar technology made fabrication of the circuits simpler and easier than most such circuits.

25 Claims, 4 Drawing Sheets

INTEGRATED PHOTODETECTOR-AMPLIFIER DEVICE

TECHNICAL FIELD

The invention is a semiconductor, more particularly, an integrated photodetector-amplifier device.

BACKGROUND OF THE INVENTION

The rapid development of optical technology, especially optical communication technology, has increased the importance of various kinds of optical devices. Particularly important among these optical devices are optical detectors. High sensitivity and high speed are among characteristics of importance for optical detectors used in optical communication systems. Also of importance are high signal gain and high reliability as well as ease in maintaining the optical detector device under typical commercial operating conditions.

A number of references are useful as background in this area of technology. Particularly illuminating is an article entitled "Recent Developments in Monolithic Integration of InGaAsP/InP Optoelectronic Devices" by U. Koren et al, *IEEE Transaction on Microwave Theory and Techniques*, MTT-30 (10), October 1982, pp. 1641–1649. Another article useful in understanding the invention is entitled "A Self-Aligned $In_{0.53}Ga_{0.47}As$ Junction Field-Effect Transistor Grown by Molecular Beam Epitaxy" by D. Wake et al, *IEEE Electron Device Letters*, EDL-5 (7), July 1984, pp. 285–287.

SUMMARY OF THE INVENTION

The invention is an integrated photodetector-amplifier structure featuring a p-region, intrinsic region, n-region photodetector (PIN photodetector) and a self-aligned junction field-effect transistor (JFET) incorporated in the same integrated circuit. The photodetector is back illuminated, features a buried p-n junction so as to avoid surface leakage, vertical integration so that partial regrowth is not needed and an air bridge to isolate the capacitance of the PIN electrode (the p-contact on the PIN structure) from the JFET structure. Such integrated photodetector devices have extraordinary properties including high sensitivity, high response frequency and ease of fabrication. The invention includes integrated structures with multiple elements; that is, more than one PIN and/or more than one JFET element. Indeed, a preferred embodiment of the invention is an integrated PINFET structure featuring a dual gate to minimize parasitic capacitance from n-contacts. Another embodiment features a PINFET integrated with a transimpedance amplifier to provide additional stages of amplification and to provide negative feedback to the input stage.

DETAILED DESCRIPTION

The invention is based on the discovery that a vertically integrated photodetector-amplifier could be made using epitaxial growth techniques and semiconductor processing techniques. This photodetector-amplifier structure has a number of features that are highly advantageous. First, it is made by putting down epitaxial layers without any melt-back or regrowth steps. The junction is buried under the epitaxial layers so that surface leakage is not a problem. There is an air bridge between the p-contact of the PIN photodetector and the gate electrode of the junction field-effect transistor (JFET). The structure is self-aligned to facilitate the fabrication of fine-line gate structures. The structure is nearly planar (does not have sudden, sharp steps or ridges) so that conventional fabrication techniques can be used to make the integrated detector-amplifier device.

The invention is best illustrated by a detailed description of one embodiment of the invention; namely, a detector-amplifier combination usually called a PINFET made for radiation detection at wavelengths less than 1.65 μm. It should be recognized that the PINFET is the basic unit of the invention but more elaborate circuits (usually containing more JFET structures) may be used in the practice of the invention. Also, reasonable variations of this embodiment which use the basic principles of the invention are also included in the invention. This structure is useful in illustrating the principles of the invention although in practice more elaborate configurations are often used.

First is described a side view of the PINFET to show the epitaxial layer structure, the p-diffusion region and air bridge from the p-contact on the PIN photodetector structure to the gate electrode of the JFET structure.

Figure 1:
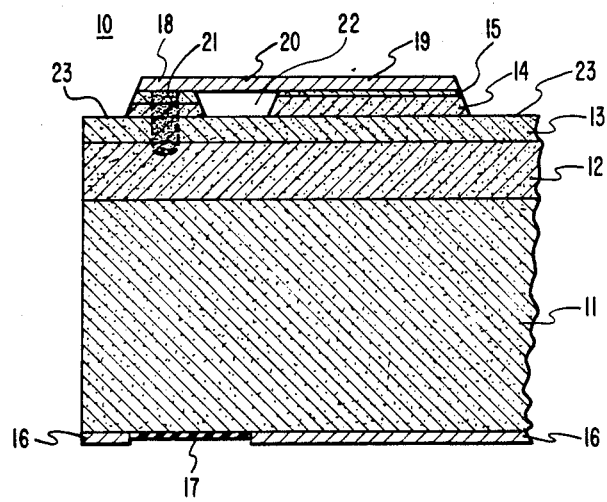
FIG. 1 shows a side view of an integrated PINFET structure.

FIG. 1 shows a side view of the PINFET cut through the PIN detector part and the gate width of the field-effect transistor. The PINFET 10 is made up of layers of III–V semiconductor compounds beginning with a substrate 11 of $N^+$-InP generally doped in the range from $1-5 \times 10^{18}$ atoms/cm$^2$ with tin or sulfur. This layer is generally about 150 μm thick. On top of this layer is an undoped (intrinsic) layer 12 of InGaAs (approximate composition $In_{0.53}Ga_{0.47}As$) lattice-matched to InP. The thickness of this layer is about 5 μm. The bandgap of this layer (0.75 eV) is such as to ensure absorption of the incident radiation (radiation with energy greater than 0.75 eV or wavelength shorter than 1.65 μm) in the layer and the doping level is low to ensure extension of the electric field gradient throughout the layer. Generally, impurities make the doping n-type with a concentration of about $5 \times 10^{14}$ atoms/cc.

On top of this layer 12 is a thin layer 13 of semi-insulating material (often called the channel confinement layer), generally semi-insulating InP (bandgap of 1.35 eV) or undoped InAlAs (bandgap of 1.4 eV). The thickness is generally about 1 μm. This layer serves to isolate the JFET electrically from the remainder of the circuit and provide an insulating layer against which the channel layer can be pinched off. The composition of InAlAs for lattice-matching to InP is approximately $In_{0.52}Al_{0.48}As$. The semi-insulating InP is usually Fe doped either by ion implantation or grown by Mo-CVD metallo-organic chemical vapor deposition.

Above the insulating layer are two more III–V semiconductor layers used to form the n and p layers of the JFET. These layers are n-type InGaAs 14 (lattice-matched to InP) and p-type InGaAs 15 (lattice-matched to InP). Other materials (principally InP or InGaAsP) may be used for these layers. Typical thicknesses are 0.4 μm for the n-InGaAs and 0.6 μm for the p-InGaAs. These layers are loosely referred to as the n-type JFET layer (or channel layer) and the p-type JFET layer. These layers will be discussed in more detail below.

Various metallizations are also part of the PINFET structure. For example, attached to the N+-InP is an n-type contact 16 (typically Au-Sn) with an opening to admit radiation. The N+-InP 11 surface exposed by the opening in the n-type contact 16 is covered with an anti-reflection (AR) coating 17 to reduce reflections at the surface.

Also shown are some p-contacts generally made of Cr-Au alloy. For example, such an alloy forms the p-contact 18 for the PIN part of the structure and the p-contact 19 for the JFET gate electrode. The same metallization forms the air bridge 20 connecting the PIN part of the circuit to the gate 19 of the JFET.

Also shown is the P+-type region 21 which forms the p region of the PIN structure. This is generally introduced by diffusing zinc into the top layers (14 and 15) prior to putting down the p-contact of the PIN structure. Doping concentration is usually in the range $10^{18}$–$10^{19}$ atoms/cm$^3$. Various passivating layers may also be used (e.g., SiN$_x$) but are not shown. Because the section shown goes down the center of the gate electrode, the source and drain electrodes are not shown.

Two important features of the invention are worthy of emphasis; namely, the air bridge 22 which isolates the PIN electrode from the gate electrode of the JFET and the mesa isolation trenches 23 which surround the PIN structure and isolate it from the JFET structure.

The salient features of this structure are as follows:

1. The P-N junction of the PIN structure is buried inside the structure giving excellent passivation and avoiding surface leakage.

2. This is a vertically integrated structure where regrowth is not necessary. Further, it is a self-aligned structure where the thickness of the p-InGaAs layer determines the extent of undercutting of the gate electrode as shown below.

3. The air bridge isolates the electrical characteristics (e.g., capacitance) of the PIN structure from the JFET permitting higher frequency response and more rapid response times.

Figure 2:
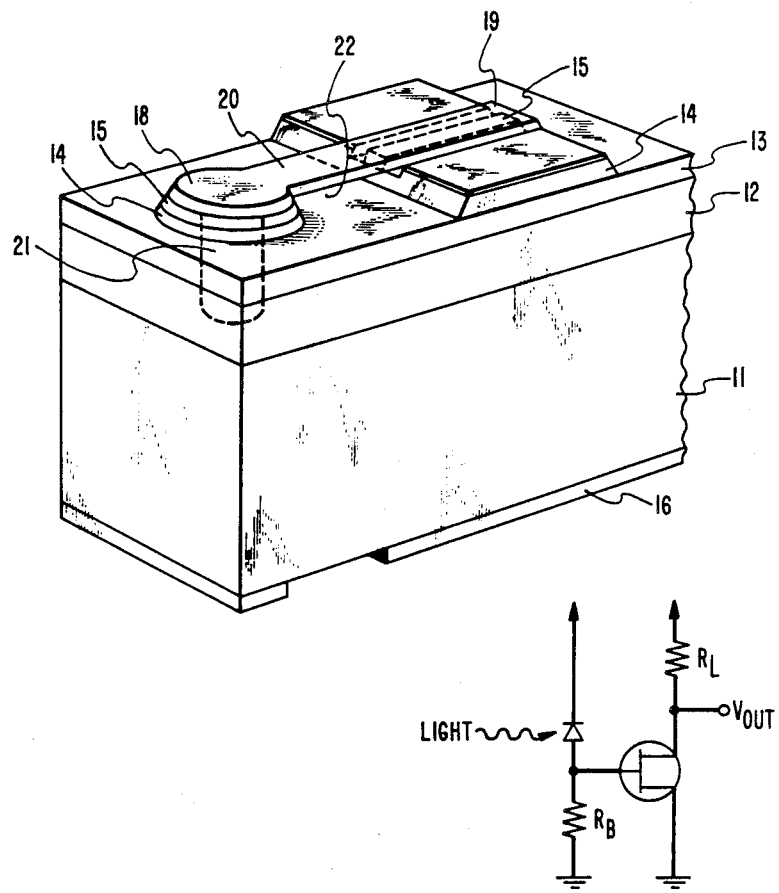
FIG. 2 shows a prospective view of the same structure as shown in FIG. 1.

FIG. 2 shows a perspective view of the same structure with the p-contact 18 on the PIN photodetector, the air bridge 20 and the gate electrode 19 of the JFET structure. Also shown are the p-type InGaAs 15 and n-type InGaAs layer which are present both in the PIN part of the structure and the JFET part of the structure. These layers are removed between the PIN and JFET parts of the structure (under the air bridge 22) so as to provide electrical isolation between photodetector and amplifier parts of the structure. The insulating layer (or channel confinement layer) is found below these layers, again to electrically isolate the PIN part of the structure from the JFET part of the structure and to serve as the confinement layer in the JFET structure. Next is the absorption layer 12 typically made of InGaAs lattice-matched to InP and the InP substrate 11. An n-type contact layer 16 serves as one of the electrical contacts to the structure. A p-contact layer 19 is shown on top of the structure.

Also shown in relief is the P+-type region 21 which extends through the JFET layers 14, 15 and through the insulating layer 13 and partially into the absorbing layer 12. This forms the p-n junction of the photodetector and provides conduction to the p-contact 18 of the PIN photodetector. Thus, the p-n junction of the photodetector structure is buried inside the structure rather than on the surface. Also shown in FIG. 2 is a circuit diagram of the structure.

Figure 3:
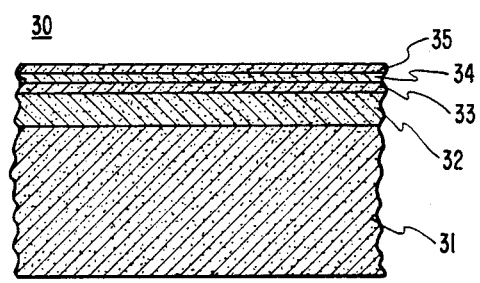
FIG. 3 shows a side view of an epitaxial layer semiconductor structure useful in the fabrication of PINFET structures.

A particular advantage of the inventive structure is the ease of fabricating the structure in such a way as to obtain optimum operation. A convenient point to begin a description of the fabrication procedure is at the layered structured 30 as shown in FIG. 3. This structure is made by various epitaxial layer growth techniques starting with an N+-InP substrate.

The structure 30 consists of an N+-InP substrate doped with sulfur or tin in the concentration range from $1$–$5 \times 10^{18}$ atoms/cm$^3$. This layer is eventually thinned down to a thickness of 150 μm generally later in the fabrication procedure. On top of the substrate is an undoped layer 32 of InGaAs with a thickness of approximately 5 μm. This layer has approximate composition In$_{0.53}$Ga$_{0.47}$As so that it is approximately lattice-matched to InP. Impurities generally make this layer n-type with a doping concentration in the range of $1$–$30 \times 10^{14}$ atoms/cm$^3$. Next is found an intrinsic layer 33 usually made of semi-insulating iron doped InP or undoped lattice-matched InAlAs. This is often called the channel confinement layer. The thickness of this layer is approximately 1 μm. Next comes the two JFET layers: first the n-type InGaAs layer 34 generally doped with silicon in the concentration range of $4$–$8 \times 10^{16}$ atoms/cm$^3$. The thickness of this layer, often called the channel layer, is generally between 0.3 and 0.5 μm.

The other JFET layer is a p-InGaAs layer 35 and is typically doped with Be. Often the doping concentration is different in different parts of the p-InGaAs layer. For most of the thickness of the p-InGaAs layer (typically 0.5 to 0.6 μm) including at the interface with the n-InGaAs layer, the doping concentration is about $1$–$5 \times 10^{18}$ atoms/cm$^3$; for a thin layer on top of the p-layer (typically 500 Angstroms), the doping concentration is about $1$–$2 \times 10^{19}$ atoms/cm$^3$.

An exemplary process for fabricating this structure is as follows: before carrying out any processing steps, the structure shown in FIG. 3 is oriented so that a <110> direction in the [100] wafer is directed so that the long dimension of the gate (gate width) lies along this direction.

First, the p-diffusion procedure is carried out to form the p-n junction of the PIN structure. A SiN layer is deposited on the p-InGaAs. This is patterned to serve as a diffusion mask to define the active PIN area 21 in FIG. 2. The zinc vapor diffusion is carried out so that the diffusion depth just penetrates the upper portion of the intrinsic InGaAs layer 12. After the diffusion, the SiN mask is removed. Alternatively the SiN mask may be used to etch away the p and n InGaAs layers in the diffusion region, followed by zinc diffusion through the semi-insulating layer alone.

Then the p-contact metal patterns (including the PIN contact and gate contacts of the various FETS) are defined photolithographically using Cr-Au or other suitable p-contact metals.

These metal contacts are made so they can serve as shadow masks when the source and drain of the JFETs are formed.

A note on nomenclature might be of use at this point. The dimension of the gate electrode in the plane of the channel layer pointing toward source and drain electrodes is called the length of the gate even though this is usually the short dimension of the gate electrode and the direction perpendicular to the length, usually extending between source and drain electrodes is called the width of the gate although this is often the long dimension of the gate electrode.

A critical part of the fabrication procedure is removal of the p-layer (including some undercutting of the gate electrode) without substantially affecting the n-layer or substrate. Generally, the exact procedure depends on the nature of the III–V semiconductor material in the n-layer and p-layer.

Particularly important in the practice of the invention is obtaining a suitable shape for the undercut post p-type material so that the gate electrode acts as an effective shadow mask for the evaporated source. The p-InGaAs layer is etched away using a 50 volume percent solution of citric acid with added aqueous hydrogen peroxide and an electrical monitoring system to measure the progress in the etching process. The current-voltage characteristics of two adjacent gate electrodes are measured and the etch stopped when the resistive characteristics disappear and only back-to-back diode characteristics remain. This indicates removal of the p-layer between adjacent gate electrodes with only the p-n junction under each gate electrode remaining. Removal of the p-layer also results in undercutting under the gate electrode by a distance approximately equal to the original thickness of the p-layer. The overhang of the gate electrode over the p-layer post ensures self-alignment of the source and drain electrodes deposited later.

The n-contact metallization of source and drain of the JFET is put down by standard photolithographic techniques using typically Ge-Au. This is a self-aligned process because of the overhang on the undercut gate. This yields very close spacings between drain and source contacts (typically 2 $\mu$m) without the danger of contact with the p-layer.

Next, mesa isolation is carried out by covering the JFET structure and etching away the n-InGaAs including the bridge region 22. Typical etchant is 50 volume percent citric acid with aqueous hydrogen peroxide. At this point, the substrate (N+-InP) may be thinned to 150 $\mu$m.

On the back side of the substrate (N+-InP), an n-contact is put down except for openings directly underneath the active PIN areas to allow admittance of incident light.

A number of variations may be used in the practice of the invention. For example, other III–V semiconductor materials may be used for the two JFET layers provided they are lattice-matched to the InP substrate (or other material lattice-matched to the InP substrate). The device described above and in FIGS. 1, 2 and 3 uses lattice-matched InGaAs (approximate composition $In_{0.53}Ga_{0.47}As$). Other materials that could be substituted for InGaAs at either the n-layer or p-layer are as follows: InGaAsP lattice-matched to InP, InP, other ternary or quaternary III–V compounds that can be lattice-matched to InP.

Typical combinations and etching systems are as follows:

1. Both p-layer and n-layer are InP. Typical etches are hydrochloric-phosphoric acid (typically in the volume ratio of 1:4 using concentrated hydrochloric acid) sometimes with small amounts of hydrogen peroxide added, or alternatively bromine-methanol (usually dilute solution). The same monitoring technique can be used as described above. Typical etch rate is 3000–6000 Angstroms/minute.

2. P-layer InGaAs (or InGaAsP) lattice-matched to InP and n-layer InP. A typical etch is citric acid—with aqueous hydrogen peroxide mentioned above. The etch will remove the p-layer and stop at the n-type InP. The etch rate is about 800–1200 Angstroms/minute. The same monitoring procedure as described above can be used to observe the progress of the etching process. However, since the etch rate greatly decreases on reaching the InP, this technique is largely self-stopping and thus electrical monitoring is not essential.

3. P-layer is InP and n-layer is InGaAs or InGaAsP lattice-matched to InP. A typical etch is HCl; phosphoric acid (composition described above) which etches InP but not InGaAs or InGaAsP. Again, the etching process can be monitored as described above, although once again this is not essential to successful processing.

Figure 4:
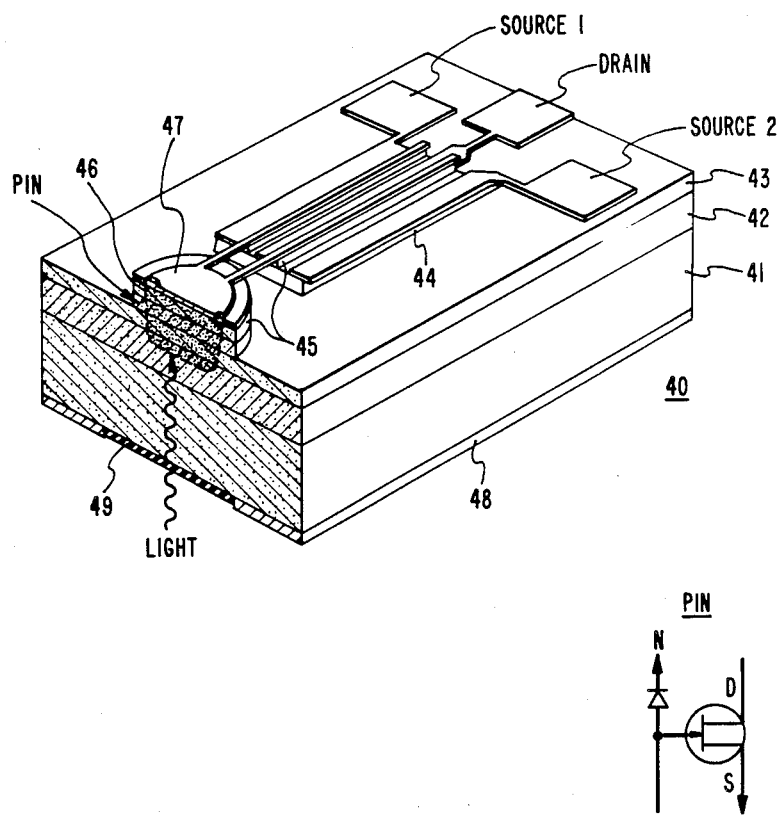
FIG. 4 shows a variation of the PINFET structure described in FIGS. 1 and 2.

FIG. 4 shows a variation of the PINFET structure 40 described above, in which a double gate electrode is used to decrease the long dimension of the device. In addition, the double gate structure reduces the area of the drain pad needed, thus reducing the capacitance of the drain electrode. The device is very similar to the device described above except for the double gate electrode and two outside source electrodes. The device is made up of substrate 41 made of N+-InP, an absorbing layer 42 made of intrinsic InGaAs, buffer or isolation layer 43 (usually called channel confinement layer) made of undoped AlInAs or iron-doped semi-insulating InP, channel layer 44 of n-type InGaAs and P+-layer of InGaAs 45 (gate p-layer) for the junction on the JFET. Again, we see the p-diffusion region 46 under the PIN electrode 47, the n-contact 48 to the InP substrate and the opening, with anti-reflection coating 49 under the PIN structure. The circuit diagram is much like the one for the simple-gate structure shown in FIGS. 1 and 2.

Figure 5:
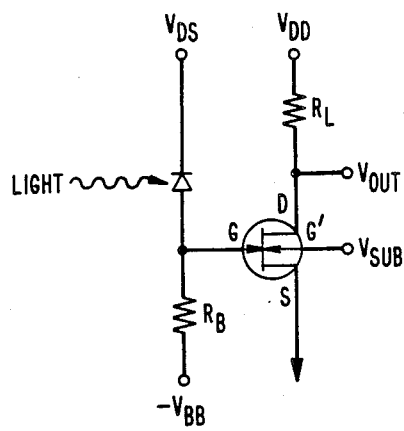
FIG. 5 shows a circuit diagram useful in the practice of the invention.

The basic PINFET structure is usually incorporated in various kinds of structures so as to integrate photodetector, amplifier and various other circuit elements in one semiconductor chip. FIG. 5 shows a typical basic circuit unit in which the invention is often used. Here, $R_B$ is a bias resistance and $R_L$ is a load resistance of the circuit.

In most circuit applications, the resistors ($R_B$ and $R_L$) are usually made in the form of FETS appropriately biased and placed in the semiconductor structure to produce the desired characteristics. Generally, the load resistance is produced by a JFET structure close to identical to the JFET structures described above so as to minimize capacitance and produce good electrical characteristics even when doping profile is not optimum. Often, such a FET has the gate electrode connected to the source electrode. The bias resistance is also usually supplied by a FET structure but not necessarily a structure as described above and has a large gate length compared to the JFETS described above.

Figure 6:
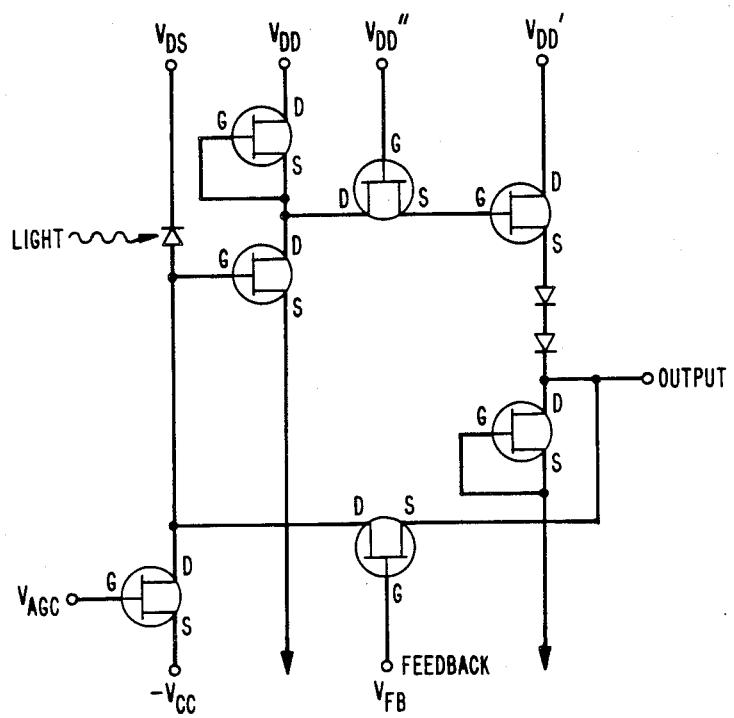
FIG. 6 shows a circuit diagram useful in the practice of the invention.

More complex circuits are also useful in the practice of the invention. FIG. 6 shows a typical transimpedance amplifier circuit, including cascode stage useful in the practice of the invention.

What is claimed is:

1. A semiconductor device comprising at least one PINFET structure, said PINFET structure comprising:
   (a) first region comprising n-type III–V semiconducting compound;
   (b) second epitaxial region comprising intrinsic III–V semiconductor compound, said second epitaxial layer contacting at least a portion of the first region;
   (c) third epitaxial region comprising semi-insulating III–V semiconductor compound, said third epitaxial region contacting at least a portion of the second epitaxial region;
   (d) a JFET portion of the PINFET structure comprising fourth epitaxial region comprising III–V semiconductor compound with n-type conductivity said fourth epitaxial region contacting at least a portion of the third epitaxial region;
   (e) fifth epitaxial region comprising III–V semiconductor compound with p-type conductivity and contacting at least a portion of the fourth epitaxial region, said fifth epitaxial region having a length;
   (f) source and drain electrodes, said source and drain electrodes contacting said fourth epitaxial region;
   (g) gate electrode contacting said fifth epitaxial region and having a length;
   (h) a PIN portion of the PINFET structure comprising a sixth epitaxial region comprising III–V semiconductor compound with n-type conductivity, said sixth epitaxial region contacting at least a portion of the third epitaxial region but not contacting the fourth or fifth epitaxial regions;
   (i) seventh epitaxial region comprising III–V semiconductor compound with p-type conductivity contacting at least a portion of the sixth epitaxial region but not contacting the fourth or fifth epitaxial regions;
   (j) a p-contact comprising conductive material contacting at least a portion of the seventh epitaxial region;
   (k) the p-contact electrically connected to the gate electrode;
   (l) a p-type conductivity region extending from under the p-contact through the seventh epitaxial region, the sixth epitaxial region, the third epitaxial region and at least contacting the second epitaxial region.

2. The semiconductor device of claim 1 in which the gate electrode is positioned on the fifth epitaxial region so that it overhangs the fourth epitaxial region.

3. The semiconductor device of claim 2 in which the length of the gate electrode is less than or equal to the distance between source and drain electrodes.

4. The semiconductor device of claim 1 in which the length of the fifth epitaxial region measured along its interface with the fourth epitaxial region is less than the length of the gate electrode.

5. The semiconductor device of claim 4 in which the first region is a substrate of n-type InP and the second, third, fourth, fifth, sixth and seventh epitaxial regions are III–V semiconductor compounds with compostions that are lattice-matched to InP.

6. The semiconductor device of claim 5 in which the III–V semiconductor compound of the second epitaxial region is intrinsic InGaAs with composition such that the InGaAs is approximately lattice-matched to InP.

7. The semiconductor device of claim 6 in which the third epitaxial region is undoped InAlAs with composition so that the InAlAs is lattice-matched to InP.

8. The semiconductor device of claim 6 in which the third epitaxial region is semi-insulating InP.

9. The semiconductor device of claim 8 in which the semi-insulating InP is Fe doped InP deposited by metallo-organic chemical vapor deposition.

10. The semiconductor device of claim 1 in which the fourth and sixth epitaxial regions and the fifth and seventh epitaxial regions comprise the same III–V compound semiconductor.

11. The semiconductor device of claim 10 in which the fourth and sixth epitaxial regions comprises n-type InP and the fifth and seventh epitaxial regions comprise p-type InP.

12. The semiconductor device of claim 11 in which the n-type InP is doped with an element selected from the group consisting of tin, silicon, sulphur and tellurium.

13. The semiconductor device of claim 11 in which the p-type InP is doped with an element selected from the group consisting of cadmium, zinc, magnesium and beryllium.

14. The semiconductor device of claim 11 in which the fourth and sixth epitaxial regions are n-type InGaAs and the fifth and seventh epitaxial regions are p-type InP.

15. The semiconductor device of claim 10 in which the fourth and sixth epitaxial regions comprise different III–V semiconductor compounds from the fifth and seventh epitaxial regions.

16. The semiconductor device of claim 15 in which the fourth and sixth epitaxial regions comprise n-type InP and the fifth and seventh epitaxial regions comprise p-type InGaAs.

17. The semiconductor device of claim 15 in which the fourth and sixth epitaxial regions comprise n-type InGaAs and the fifth and seventh epitaxial regions comprise p-type InP.

18. The semiconductor device of claim 1 in which the electrical connection between the p-contact and the gate electrode comprise an air bridge so that sixth and seventh epitaxial regions do not electrically contact the fourth and fifth epitaxial regions.

19. The semiconductor device of claim 1 in which the source electrode and drain electrode are within 2 $\mu$m of the fifth epitaxial region.

20. The semiconductor device of claim 19 in which the source electrode and drain electrode are within 1.0 $\mu$m of the fifth epitaxial region.

21. The semiconductor device of claim 1 in which the length of the fifth epitaxial region is less than 5 $\mu$m.

22. The semiconductor device of claim 1 in which the overhang of the gate electrode over the fifth epitaxial region is between 0.3 and 1.0 $\mu$m.

23. The semiconductor device of claim 1 in which the thickness of the fourth epitaxial region is less than 1 $\mu$m.

24. The semiconductor device of claim 1 in which the thickness of the fifth epitaxial region is less than 1 $\mu$m.

25. The semiconductor device of claim 1 in which a double gate electrode is used with the drain electrode substantially between the two gate electrodes.

* * * * *